United States Patent [19]
Dunn et al.

[11] Patent Number: 6,018,383
[45] Date of Patent: Jan. 25, 2000

[54] VERY LARGE AREA PATTERNING SYSTEM FOR FLEXIBLE SUBSTRATES

[75] Inventors: Thomas J. Dunn, Mohegan Lake, N.Y.;
Nestor O. Farmiga, Clifton, N.J.;
Marc Zemel, Dobbs Ferry, N.Y.; Carl Weisbecker, Mount Vernon, N.Y.;
Kanti Jain, Briarcliff Manor, N.Y.

[73] Assignee: Anvik Corporation, Hawthorne, N.Y.

[21] Appl. No.: 08/915,130

[22] Filed: Aug. 20, 1997

[51] Int. Cl.[7] ........................... G03B 27/48; G03B 27/42; G03B 27/54
[52] U.S. Cl. .................... 355/49; 355/53; 355/67
[58] Field of Search ................. 355/49, 53, 67, 355/27, 71, 50; 226/27; 430/22

[56] References Cited

U.S. PATENT DOCUMENTS

| | | | |
|---|---|---|---|
| 4,975,733 | 12/1990 | Kumagaya et al. | 355/49 |
| 5,285,236 | 2/1994 | Jain | 355/53 |
| 5,328,073 | 7/1994 | Blanding et al. | 226/27 |
| 5,760,880 | 6/1998 | Fan et al. | 355/67 |
| 5,905,007 | 5/1999 | Ho et al. | 430/22 |

*Primary Examiner*—Safet Metjahic
*Assistant Examiner*—Peter B. Kim
*Attorney, Agent, or Firm*—Carl C. Kling

[57] ABSTRACT

In the manufacturing of flexible, large-area electronic modules such as flat-panel displays (FPDs), the high cost and low yields of currently available patterning equipment represent a significant barrier to cost-effective production. This invention provides a projection imaging system that can pattern very large, flexible substrates at very high exposure speeds with almost any desired image resolution. The master pattern to be imprinted on the substrate is contained on a mask which, similar to the substrate, is made of a flexible material The mask and substrate are scanned by rollers through the object and the image field, respectively, of a 1:1 projection lens. All of the rollers are driven by identical drive systems linked to a common motor; therefore, the scanning of the mask and substrate is perfectly synchronized. Both the mask and the substrate, along with their rollers, are mounted on a linear translation stage. The translation stage scans continuously at a velocity which is chosen such that, for every complete rotation of the mask and substrate, the linear stage will move by the effective scan width. The entire substrate is patterned using one continuous helical scan. Suitable overlap between complementary intensity profiles produced by a hexagonal illumination configuration ensures seamless joining of the scans. The use of rollers significantly enhances the throughput and effectively reduces the payload and footprint of the scanning stage leading to substantial system cost savings.

27 Claims, 6 Drawing Sheets

TABLE 1

| Imaging Concept | Seamless Scanning Projection |
|---|---|
| Illumination Source | XeF excimer laser |
| Illumination Wavelength | 351 - 353.5 nm |
| Projection System | 1:1 Magnification Refractive Lens |
| Numerical Aperture | 0.02 |
| Resolution | 15 μm |
| Field Size | 60 mm |
| Depth of Focus | 850 μm |
| Throughput 60" diagonal 30 s overhead | 46 panels/hr    9.2 sq. ft / min |

VERY LARGE AREA PATTERNING SYSTEM FOR FLEXIBLE SUBSTRATES

FIELD OF THE INVENTION

This invention relates to projection imaging of patterns on very large substrates, and particularly relates to high-throughput, high-precision patterning of a flexible substrate material for cost-effective production of very large electronic modules such as displays.

BACKGROUND OF THE INVENTION

Importance of Patterning Tools in Electronic Module Production

Flat panel display (FPD) applications are calling for ever larger display sizes for rapid retrieval and interpretation of large blocks of data. Presenting information to large groups of people requires conference displays with areas of up to 6 feet by 8 feet (120 inch diagonal.) Displays of this type that are manufactured on flexible substrates are preferred over conventional rigid substrates since they are considerably more rugged, reliable, and cost-effective. Currently, there are no technologies that are capable of producing large area displays on flexible substrates. This invention satisfies this need.

In the manufacturing of many electronic modules such as flat-panel displays (FPDs), the production equipment represents a major cost element, accounting for approximately two-thirds of the total facility cost. Of the many process steps involved in electronic module fabrication, the most critical are those required for patterning the dielectric and metal layers. The capabilities and cost-effectiveness of the lithography technology impact the performance and cost of the module, and ultimately determine the size and cost at the electronic system level. This makes patterning tools the largest and most critical component of the total production equipment investment. Typical costs of individual tools range between $2 and 5 million. A high-volume production facility would have multiple lithography tools. In addition, operating expenses add several hundred thousand dollars per year to the net cost of running such tools. Thus, significant progress will be made toward wider commercial applicability of low-cost electronic modules by development and implementation of new, high-throughput, cost-effective patterning equipment.

Existing patterning tools for exposing large substrate panels suffer from numerous shortcomings, as described below. Tools that can pattern large, flexible substrates with high yields, and at a low cost per exposure, do not exist. Thus, there is a great need for a patterning system that can help produce electronic modules cost-effectively on flexible substrates.

Current Patterning Technologies

There are three primary types of patterning systems currently available: contact printing systems, projection imaging systems, and focused-beam laser direct-writing systems.

Contact printing suffers from two inherent disadvantages: generation of defects during patterning, and mask life degradation. Defects during patterning are caused by repeated contact between the mask and the photoresist-coated surface. Frequent mask-to-substrate contact also shortens mask life, adding to overall cost. Proximity printing overcomes this problem since a uniform gap is maintained between the substrate and the mask. However, any variation in the gap results in feature size or shape variation. As panel size increases, it becomes extremely difficult to maintain a uniform mask-to-substrate gap.

Conventional single-field projection imaging systems eliminate the disadvantages of contact printing resulting from defects and wear, but are limited in the largest substrate size they can expose due to their small image field. Step-and-repeat projection systems overcome this constraint by partitioning the substrate into several segments; however, this decreases throughput and creates the difficult requirement of precisely stitching the segments together. This does not pose a problem when the pattern being exposed is smaller than the image field, but when the entire substrate is one continuous pattern, defects due to stitching errors significantly reduce production yields.

Laser direct-writing systems, which write the pattern on the substrate with a focused raster-scanning beam, suffer from an inherently slow speed due to their bit-by-bit, serial mode of addressing. The processing times for direct-writing systems are long, ranging from a few minutes to a few hours per substrate, depending upon the resolution and complexity of the pattern data. Direct-write systems are not cost effective for high volume processing, but are used for mask fabrication and making component prototypes.

Thus, existing technologies for microelectronic patterning suffer from major shortcomings, including defect generation on the substrate, mask wear, limitations on resolution or field size, low throughput, and the inability to handle large, flexible substrates.

An imaging technology that achieves some of these objectives has been described by one of the inventors in U.S. Pat. No. 5,285,236, Large-Area, High-Throughput, High-Resolution Projection Imaging System, issued Feb. 8, 1994. The referenced patent discloses a projection imaging system in which an integrated stage assembly for both mask and substrate is used for the seamless exposure of a large area substrate; however, it does not exploit the advantages of using a flexible substrate.

Related Prior Art

Large-area exposure systems that eliminate some of the above limitations have been described by one of the inventors, Jain, in his previous patents, including: U.S. Pat. No. 4,924,257, Scan and Repeat High-Resolution Lithography System, issued May 8, 1990; U.S. Pat. No. 5,285,236, Large-Area, High-Throughput, High-Resolution Projection Imaging System, issued Feb. 8, 1994; and U.S. Pat. No. 5,652,645, High-Throughput, High-Resolution, Projection Patterning System for Large, Flexible, Roll-Fed Electronic Module Substrates, issued Jul. 29, 1997. These patents describe exposure systems which can pattern large substrates by an efficient, seamless scanning technique. The illumination system is designed to produce a hexagonal exposure region. Seamless joining of scans is achieved by partial overlap between adjacent scans, which produces a uniform exposure of the entire panel due to integration of complementary intensity profiles. The systems described in these prior patents are attractive for patterning substrates that are in the form of rigid, discrete panels or flexible substrates using planar masks, but are limited in their ability to handle very large substrates to produce displays of sizes up to 120 inches diagonal using flexible, non-planar masks. As already pointed out above, a system that provides the capability to pattern such large, flexible substrates will be a significant advantage in the manufacturing of conference-room size electronic modules. This invention provides such a system.

U.S. Pat. No. 5, 285,236, LARGE-AREA, HIGH-THROUGHPUT, HIGH-RESOLUTION PROJECTION IMAGING SYSTEM, Jain, shows seamless imaging with complementary polygonal scans, where mask and substrate are simultaneously presented for complementary overlap of small field polygonal scans. Jain discloses linear motion in each of the two dimensions that the mask and the substrate are moved, but does not disclose rotational motion for either of the two dimensions.

U.S. Pat. No. 4,975,733, ROTARY CAMERA, Kumagaya et al., shows a system for transferring the images of a stream of individual sheet paper documents to a microfilm. Kumagaya et al. to place emphasis on creating a long light path to avoid paper feed interference with the light path. Kumagaya et aL shows a projection system and method for imaging a pattern reflected from a document (paper carried on a drum) to a substrate (microfilm), synchronizing the movement of full-size documents with the much-slower movement of the microfilm. Kumagaya et aL does not, however, address any of the problems of seamlessness in scanning a large area substrate, and does not approach such dimensional tolerances as are required in microelectronics patterning, where the actual field size of the optics must be significantly smaller than any dimension of the substrate, thus requiring the joining of incremental portions of the total pattern for a seamlessly interconnected total pattern. There is a need to scan both across (X) and along (Y) the substrate. Kumagaya et aL scans only in the Y dimension, by a slit stretching across the paper sheet document. The slit image has the sheet rotating below it at paper speed. The slit image of the paper, with information, is fed along a long light path, out of the way of the paper feed, and focused by a lens onto the microfilm, which is moving at appropriately reduced speed. Having no seamlessness problem, Kumagaya et aL do not provide any rotary motion device mounted on any moving stage.

U.S. Pat. No. 5,760,880, LASER APPARATUS, Fan et al., shows in FIG. 2, and describes, apparatus for imagewise exposing a flexible substrate mounted on a rotatable drum by rotating in one dimension and linearly moving the substrate in an orthogonal second dimension. a Fan et al. has control means, rotates the substrate on "[a]... stationary support frame..." and provides motion in the other dimension by "[a]... focusing motor... moving the lens..."

U.S. Pat. No. 5,328,073, FILM REGISTRATION AND IRONING GATE ASSEMBLY, Blanding et al., positions film with a reciprocating motion of a transparent drum through a small arc. The drum provides registration of tractor-driven photographic film, using pin locators.

SUMMARY OF THE INVENTION

This invention provides a projection imaging system that can pattern very large, flexible substrates at very high exposure speeds with almost any desired image resolution. The master pattern to be transferred to the substrate is contained on the mask which, similar to the substrate, is made of a flexible material. The mask is wrapped around a set of, typically, three rollers that rotate the mask The mask is illuminated from below, and the illuminated region is imaged onto the substrate by a 1:1 projection system which is stationary and situated above the mask and substrate. The substrate wraps around the circumference of a drum that rotates the substrate through the image field of the projection lens. Since all of the rollers are driven by identical drive systems linked to a common motor, the scanning of the mask and substrate is perfectly synchronized.

In a preferred embodiment, the mask and the substrate, along with their rollers, are mounted on a linear translation stage. The translation stage scans continuously at a velocity which is chosen such that, for every complete rotation of the mask and substrate, the linear stage will move by the effective scan width. The entire substrate is patterned by one continuous helical scan. Suitable overlap between the complementary intensity profiles produced by the hexagonal illumination configuration ensures seamless joining of the scans. In other preferred embodiments, the helical scan may be replaced by serpentine scans or by rotational scans in which the translation stage steps intermittently.

The flexible substrate can be either a discrete panel, or a continuous roll of material on which many panels are to be patterned. This invention provides several embodiments that are optimized for different substrate sizes and configurations.

It is the object of this invention to provide a high-throughput, high-resolution, projection patterning system for very large, flexible substrates.

It is another object of the invention to provide an exposure system that images very large substrates, by overlapping seamless scanning, using a small-field projection system and a translation stage assembly.

It is a more specific object of this invention to provide mechanical roller systems that rotate both a flexible mask and substrate through the object and image fields, respectively, of a projection lens enabling the transfer of the master pattern on the mask to the substrate.

A feature of the invention is a functionally integrated implementation of an illumination means to produce a uniform hexagonal illumination, a roller-stage assembly to enable seamless exposure of large substrates, and means to feed and mount flexible substrates to the roller-stage assembly.

Another feature of the invention is the use of a flexible mask, and the synchronous rotation of the mask and substrate by linking both sets of rollers through identical drive systems to a common motor.

Still another feature of the invention is the provision of a mechanism for synchronized scanning by the linear translation stage at a velocity which allows an entire substrate panel to be exposed by one continuous helical scan.

An advantage of the invention is that it provides the capability of patterning very large substrates with very high throughputs at almost any desired resolution, thus eliminating the limitations of existing patterning tools.

Another advantage of the invention is the use of rollers to rotate the mask and substrate to reduce the overall footprint of the system by eliminating the trade-offs between the panel size and the lens track requirements.

Another advantage of the invention is that the use of helical scanning enhances the throughput by allowing faster scanning speeds than are possible with single-axis stages and by eliminating the overhead associated with serpentine scans.

Another advantage of the invention is that it provides the ability to pattern very large or multi-panel substrates in the form of a continuous roll at very high exposure speeds thereby significantly lowering the cost per exposure of the electronic module.

While the invention has been presented in embodiments incorporating the features described above, other objects, features and advantages of the invention will be apparent to those skilled in the art from the written description and claims and the attached drawings.

DRAWINGS AND TABLES

FIG. 1 is a schematic of the preferred embodiment of the invention in which a flexible mask and flexible substrate are wound around their respective set of rollers which are scanned synchronously so that the projection lens transfers the illuminated pattern from the mask to the substrate.

FIG. 2 presents a cross-sectional view of another embodiment to show how the rollers for the mask and substrate are linked through identical drive systems to a common motor, thus ensuring that the mask and substrate are scanned synchronously.

FIG. 3 illustrates the seamless scan-and-repeat mechanism, showing three adjacent scans generated by overlapping hexagonal illumination beams and the complementary exposure in the overlap regions which generate the seamless transitions between adjacent scans.

FIG. 4 demonstrates how the simultaneous action of the drum rotation and the slow linear translation along the drum axis leads to a continuous helical scan which covers the flexible substrate wrapped around the drum.

DETAILED DESCRIPTION OF THE PREFERRED EMBODIMENTS

Figure 1:
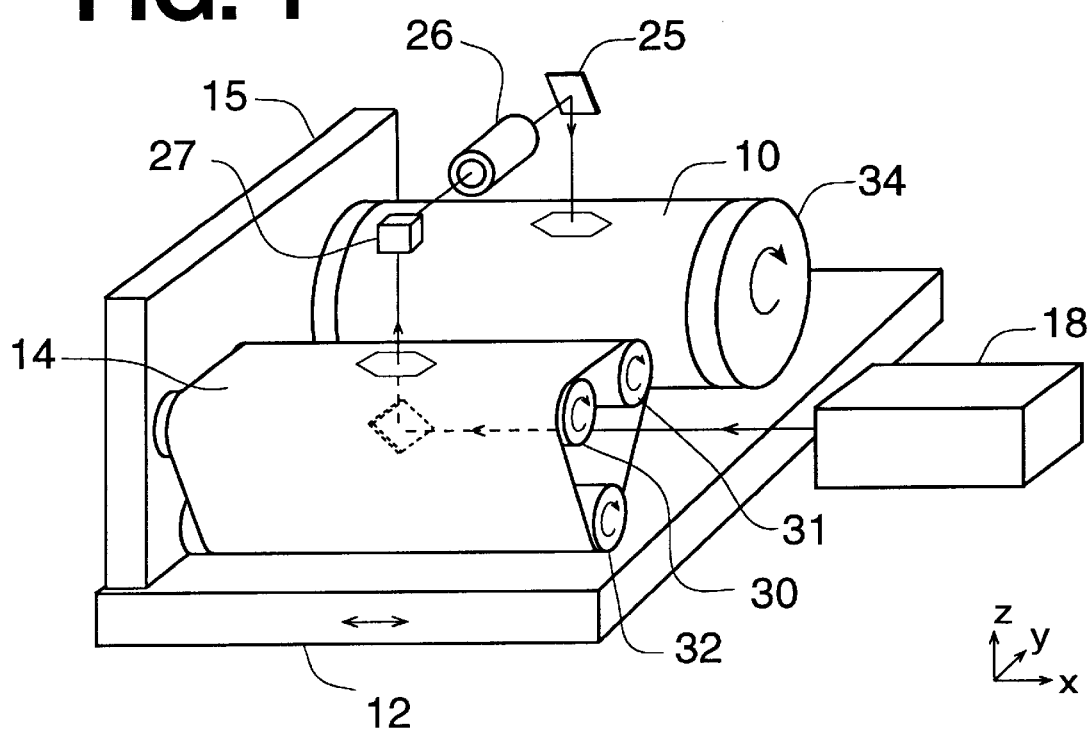

FIG. 1 shows a schematic illustration of the new system configuration. The master pattern is imprinted on a flexible material 14 that is transparent to the laser illumination wavelength. The mask 14 is wound around a set of three rollers, 30–32, which rotate the mask The mask is illuminated from below between roller 30 and roller 31 whose separation is chosen to provide the necessary clearance for the hexagonal illumination beam. The projection lens 26 has a characteristic object field and a characteristic image field. The object field of the projection lens 26 is positioned to encircle this illuminated hexagonal region. In this way, the rollers can rotate the mask to pass a continuous strip of its surface through the illuminated object field of the projection lens which images the mask pattern onto the substrate 10 wound around the circumference of drum 34. The optical imaging path also contains a fold mirror 25 and a reversing unit 27. The projection lens 26 is a refractive lens system, and the reversing unit 27 ensures that the orientation of the image on the substrate is the same as that of the pattern on the mask The mask is illuminated from below by an illumination system 18, which would typically comprise a light source and additional optical units and components for beam steering, shaping, and uniformizing. Note that the number of rollers employed to rotate the mask can be different from three; thus, alternate embodiments can easily be configured with two or four mask rollers, for example.

Since the mask and substrate rollers are driven by identical drive systems, the scanning of the mask is effectively and precisely synchronized as if the substrate and mask were on a single, planar stage. We remark that the flexible nature of the mask is not a problem for the imaging optics for two reasons: first, the region of the mask between rollers 30 and 31 can be kept sufficiently taut; and second, the depth of focus of the lithography system will be very large—several hundred microns.

Figure 2:
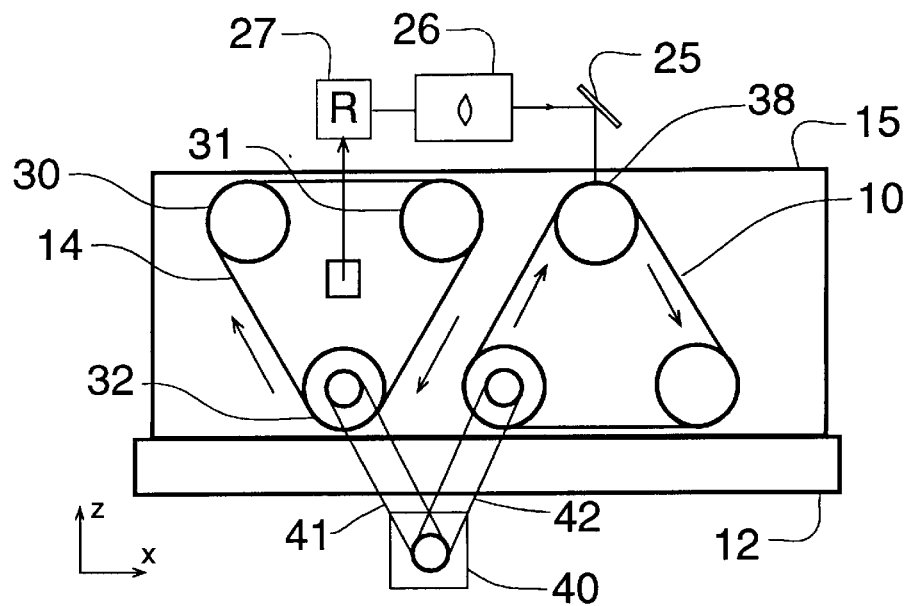

FIG. 2 shows how the rotation of the flexible mask 14 and the flexible substrate 10 is synchronized. The mask and substrate rollers are linked to the same motor 40 through identical drive systems 41 and 42. Any deviations of the drive motor from a constant rotational rate will be transferred to the mask and substrate in the same fashion. This ensures that the pattern imaged onto the substrate will be seamless and free of any imagery errors. Rather than wrap the flexible substrate around a single drum, it is also possible to use two or more rollers to scan the substrate through the image field of the projection lens as is shown in FIG. 2.

The drive motor 40 that turns the rollers for the mask and substrate need only rotate in one direction. When one revolution of the mask and substrate has been completed, the rollers continue to turn in the same direction to bring simultaneously the first edge of the mask and the substrate back into the object and image fields, respectively, of the projection lens. FIG. 1 shows both the mask and substrate along with their rollers mounted on a conventional, linear translation stage. The rollers for the mask and the substrate are mounted to a roller support structure 15 that is attached to the linear stage 12. The stage has a direction of travel that is parallel to the axis of rotation of the mask and substrate rollers. The translation stage scans continuously at a velocity which is chosen such that, for every complete rotation of the mask and substrate, the linear stage will move by the effective scan width, thus exposing the substrate in a helical scanning fashion. The effective scan width is such that, with the hexagonal illumination configuration, a complementary overlap is produced between adjacent scans, resulting in a transition from one scan to the next, that is totally seamless and free from any intensity nonuniformity.

Figure 3:
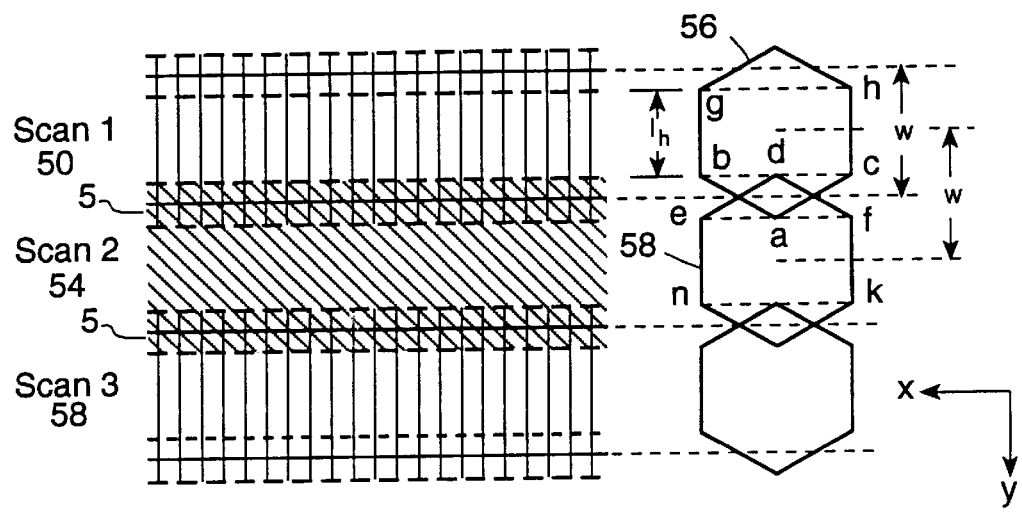

The seamless scanning exposure mechanism has been described in detail in the previous patents cited above, and is summarized here with the illustration of FIG. 3. In FIG. 3, the hexagons 56 and 58 represent the illuminated regions on the substrate for two subsequent scans, scan 1 (50) and scan 2 (54). The displacement between adjacent scans is the effective scan width w which is given by w=1.5 $l_h$, where $l_h$ is the hexagon side-length. In scan 1, the region swept by the rectangular portion b-g-h-c of hexagon 56 is not overlapped by any portion of scan 2. However, the region swept by the triangular segment a-b-c of hexagon 56 in scan 1 is re-swept in scan 2 by the triangular segment d-e-f of hexagon 58. When the doses from these triangular segments are integrated, the cumulative exposure dose anywhere in the overlapping region is the same as in the non-overlapping regions, thus producing a seamless, uniform exposure over the whole panel.

Figure 4:
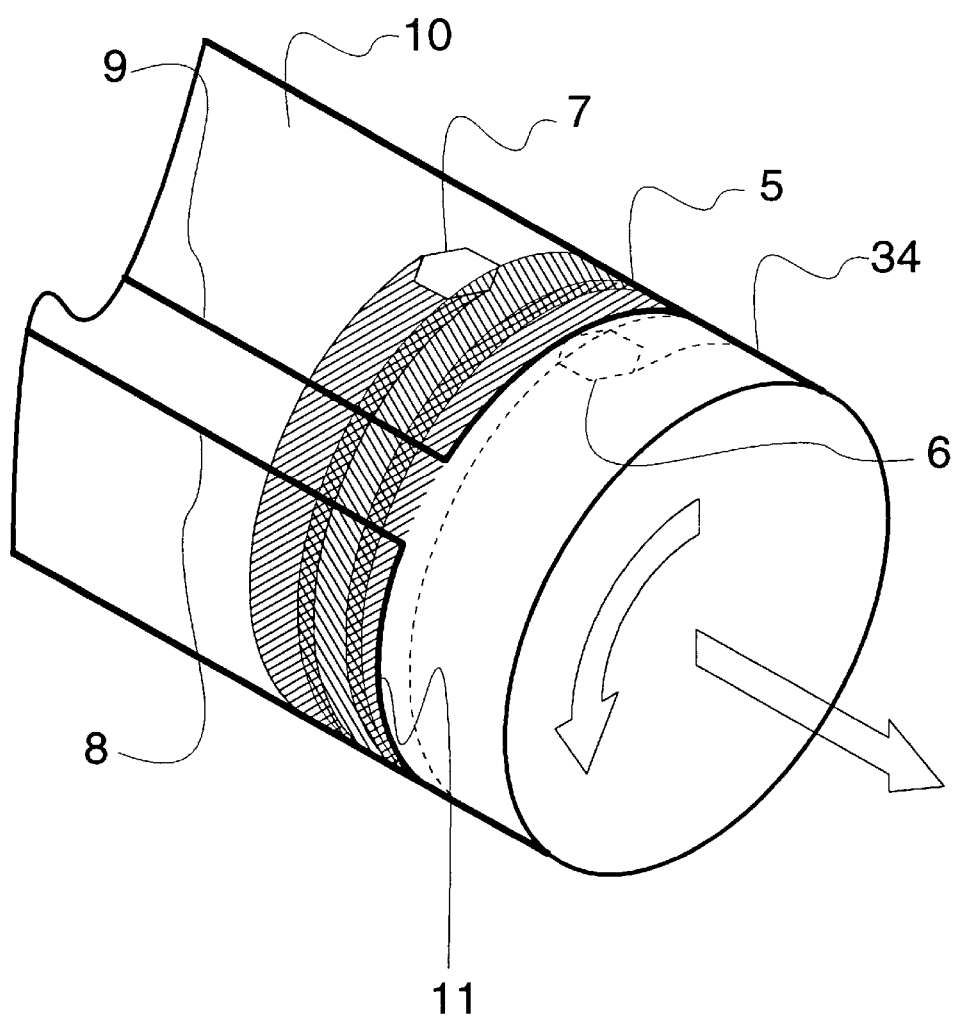

The hexagonal illumination is translated by the effective scan width between adjacent scans by the linear translation stage that scans at the appropriate linear velocity. Scanning the linear stage in this manner allows the entire substrate to be exposed by a single, continuous, helical scan. FIG. 4 shows the resulting helix from several rotations of the substrate to achieve the seamless scan. The "start" position 6 of the illumination region 7 appears below the bottom edge 11 of the substrate 10. The substrate drum 34 rotates the flexible substrate through the image field of the projection lens while the scanning stage moves the drum 34 in a direction parallel to the drum axis. For each rotation of the drum, the scanning stage moves the mask and substrate roller assembly by the effective scan width w. FIG. 4 shows how much of the substrate has been scanned after three revolutions of the substrate. The velocity of the stage, $v_t$, depends on the scanning velocity, $v_s$, as given by the expression: $v_t = 1.5\, l_h\, v_s/R$ where $l_h$ is the length of the side of the illuminating hexagon, and R is the linear distance to complete one rotation of the mask and the substrate.

Transferring the mask pattern to the substrate in a continuous helical scan offers several advantages over the boustrophedonic (serpentine) scan that is described in the patents cited above. At the end of each serpentine scan, the stage must decelerate to a halt, then reverse direction, and accelerate back to the necessary scanning velocity before the mask and substrate can enter the object and image fields, respectively, of the projection lens. The acceleration and deceleration occur while the stage steps in the orthogonal direction so that the two scans are separated by the effective scan width. In comparison, when the flexible mask and substrate are turned on rollers as shown in FIG. 1, the throughput is effectively increased since there is no longer any overhead time associated with reversing the scanning direction.

Another advantage that is achieved is the use of only a single axis stage for exposing the substrate, compared to the dual axis stages that are required in the patents cited above. The use of turning the rollers or drums to scan the substrate along one dimension not only eliminates a translation stage for that axis but also implements the scanning much more quickly than can be accomplished with the stage. This leads to a significant increase in throughput Another benefit of processing the substrate on rollers is that the effective footprint of the substrate handling hardware is considerably reduced. This reduces the overall area that the lithography tool occupies in the cleanroom manufacturing environment and leads to considerable utility savings since cleanroom space is very expensive to maintain. The footprint reduction also decreases the required payload for the scanning stage. The cost of the scanning stage rises sharply with the required payload, so reducing the footprint of the substrate on the scanning stage also leads to significant system cost savings.

In addition to reducing the footprint, use of rollers to manage the mask and substrate also relaxes the manufacturing specifications on the remaining linear translation stage. This is one of the most important benefits of reducing the distance between the object and image field of the projection lens. The current yaw specifications of commercially available stages are not adequate to pattern 5 μm features on rigid panels laying side by side with the mask when both are larger than 24×24 inches in size. The use of rollers eliminates this onerous requirement.

An additional benefit to the use of rollers is that it is simpler to meet yaw and velocity uniformity specifications than can be achieved with standard linear translation stages. Rotary encoders will provide higher accuracy and a longer range for translating large substrates than can be accomplished with linear encoders required for conventional translation stages. It is also straightforward to synchronize the motion of different sets of rollers by driving them through the same motor. In fact, the same motor can also be used to drive the linear translation stage leading to even further cost savings.

Figure 5:
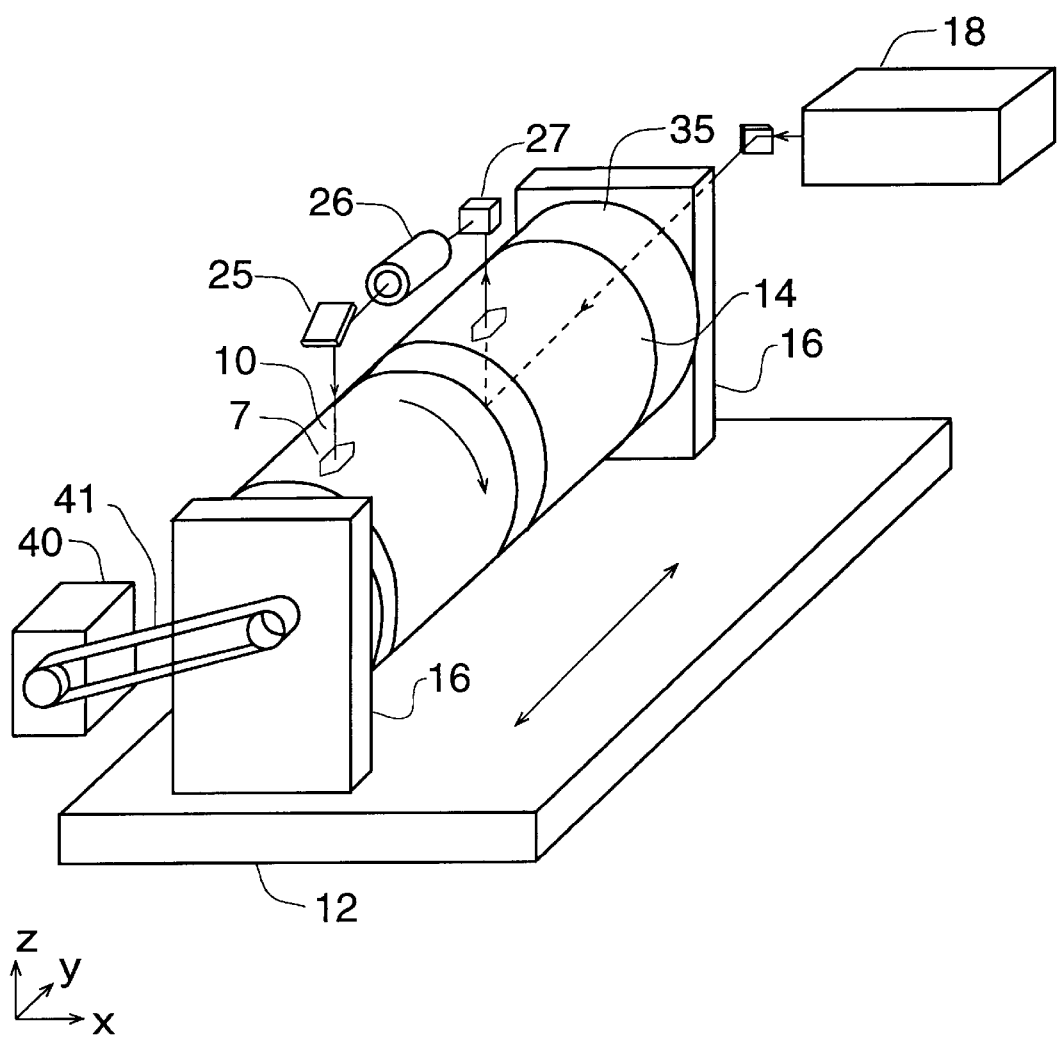
FIG. 5 shows another embodiment in which the flexible mask and substrate are mounted on a single drum which rotates as it is scanned by a translation stage along the drum axis.

FIG. 5 shows another embodiment of the invention that also employs helical scanning to transfer the mask pattern to the substrate. Rather than using different rollers to independently rotate the mask and substrate, a single drum 35 can be used to simultaneously rotate the flexible mask 14 and flexible substrate 10 through the object and image fields, respectively, of the projection lens. The flexible mask and substrate are wound around the same drum 35. The single drum is mounted on the roller support system 16 which is part of the scanning translation stage that translates the drum along a direction parallel to its axis. Unlike the original embodiment, the axis of rotation and the axis of the translation stage is parallel to the axis of the projection lens.

The embodiment of FIG. 5 has some advantages over the embodiment shown in FIG. 1. Since only a single drum is used, the payload on the scanning stage is considerably reduced. The use of a single drum also mechanically ensures that the mask and substrate will rotate at exactly the same speed without relying on the similarities of two different drive systems. Another advantage is that only a single drive system is required to link the drum to the motor 40. The disadvantage of this embodiment is that the separation of the object and image field of the projection lens is determined by the size of the panel being exposed.

Both embodiments discussed above offer many advantages for exposure of discrete panels. We have yet to describe how to perform helical scanning on a substrate that is part of a continuous roll of material. Roll-to-roll processing is considered an attractive manufacturing technology since it reduces the module cost through simpler automation and reduced overhead. By allowing the material to be processed in continuous rolls, there are fewer opportunities to contaminate or damage the material through handling. Roll-to-roll processing is also an inherently easier process to automate. This cuts down on labor costs and increases the throughput. In addition, roll-to-roll processing introduces very small overhead time to the process cycle. When handling discrete parts in a conventional process, one part must be removed before the next part can be loaded. This is not the case for fabricating electronic module panels with continuous rolls, in which removal of a processed panel from the active region of the equipment can proceed simultaneously with loading of the next panel. The reduced overhead advantage is perhaps the most important in connection with high-speed exposure systems, because, the lower the overhead is, the greater will be the effectiveness of fast exposures in delivering a higher net throughput.

Figures 6, 9:
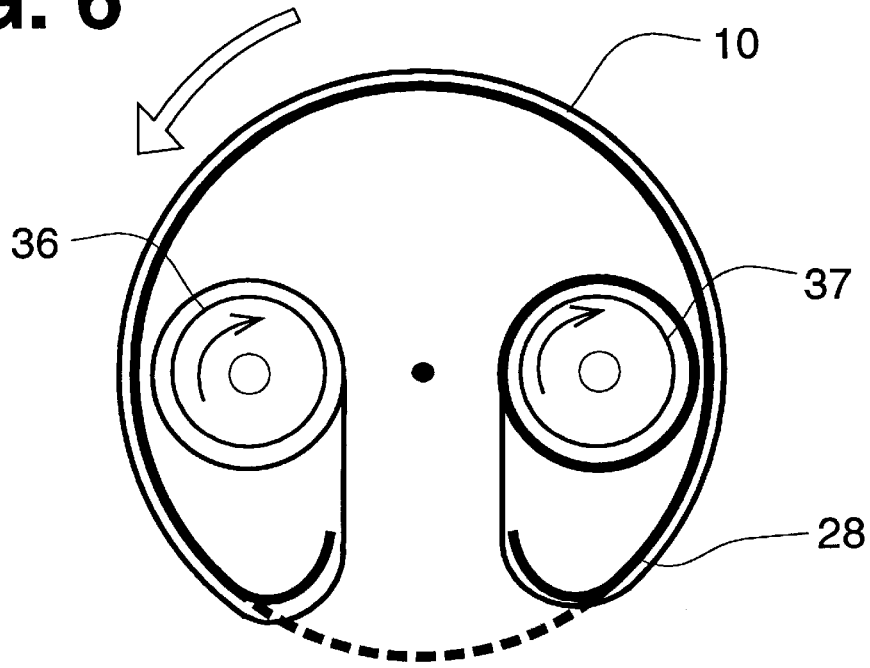
FIG. 6 shows the incorporation of a supply roller and a take-up roller inside a hollow substrate drum allowing helical scanning of a continuous roll of material.
FIG. 9 shows the relevant specifications of a system design based on this invention.

An additional embodiment that allows continuous roll to roll processing is identical to that shown in FIG. 1 except that the drum 34 contains a supply roller 36 and take-up roller 37 inside its hollow core. We show in FIG. 6 a schematic of the drum 28 that contains the take-up and supply rollers. The continuous substrate material is originally wound around the supply roller 36. When the supply roller is loaded inside the drum 28, the leading edge of the material is wound around the outside circumference of the drum before it is attached to the take-up roller 37. The panel to be exposed resides on the outside circumference of the drum with the photosensitive material facing out, and the entire assembly rotates during the helical scan for exposure. Once the panel has been exposed, the supply roller 36 and take-up roller 37 turn to advance the next panel to the outside circumference of the drum.

All of the embodiments described thus far employed helical scanning as a means to expose the substrate in a single continuous scan. It is also possible to obtain many of the advantages of handling the mask and substrate on rollers while performing serpentine scans. The principal advantage that is maintained is the use of only a single axis stage for exposing the substrate, compared to the dual axis stages that are required in the previous patents cited above. The use of turning the rollers or drums to scan the substrate along one dimension not only eliminates a translation stage for that axis but also implements the motion faster than can be accomplished with the stage. This leads to a significant increase in throughput.

Non-helical scanning can be performed by stepping the translation stage incrementally when the object and image fields of the projection lens are positioned such that they are between the leading and trailing edges of the mask and substrate respectively. The gap between the leading and trailing edges of the mask and substrate would have to be sufficiently large to allow the linear stage to implement the step by the effective scan width in less time than it takes for the rotation of the mask and substrate to cross from the trailing to the leading edge. It is also possible to stop the mask and substrate rotation when the linear stage advances the mask and substrate, and reverse the direction of rotation. This increases the similarity to the serpentine scans described in the previous patents cited above with the difference being that the scan is performed by the rotary motion rather than by the translational motion of the linear stage.

Figure 7:
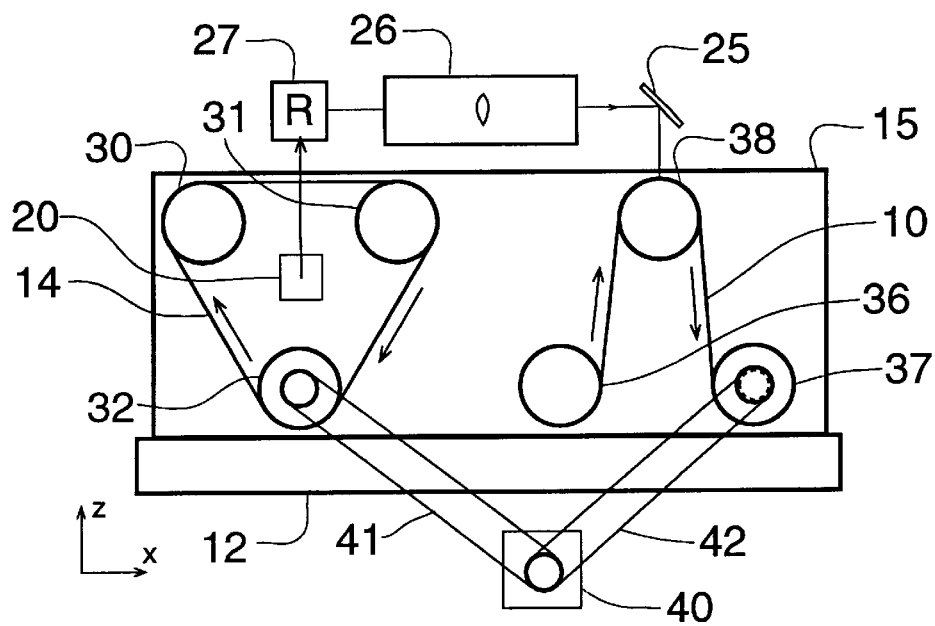
FIG. 7 is an embodiment of a serpentine scanning process used to expose a continuous roll of flexible substrate material. The linear stage is used to perform the fast scan in both directions while the rollers are used to advance the mask and substrate between scans and between panels.

We show in FIG. 7 another embodiment of this invention that transfers the image from the flexible mask to the flexible substrate through a serpentine scanning process. This embodiment is shown for exposing a continuous roll of material though it could also be used for exposing a discrete panel. The substrate is fed from the supply roller 36, wraps around the substrate drum 38, which supports the web under the image plane, and is wound onto the take-up roller 37. During exposure, the linear stage, supporting both the mask and substrate rollers through the roller support structure 15, performs the fast scan. Once the scan is complete, the rollers for both the mask and substrate turn to advance the mask and substrate by the effective scan width. The translation stage then scans the rollers in the opposite direction to seamlessly blend the next scan with the previous one. This process is continued in a serpentine fashion until the entire substrate has been exposed.

This embodiment differs from the previous configurations since the linear translation stage—not the rollers—performs the fast scan. The rollers in this configuration are used for stepping the panel between scans. This configuration also does not expose the substrate in one continuous helical scan, so it is more similar to systems cited in the previous patents that expose the substrate by a serpentine scan.

As in the first configuration, one motor is used to drive both sets of rollers with an identical drive system; also, the rollers for the mask and substrate need only turn in one direction. When the serpentine exposure is complete for one panel, the drive motor will then continue to turn in the same direction in order to advance the substrate material to position the next panel for exposure. This same action will complete the full revolution of the mask so that it is in alignment with the next panel. The entire scanning process can now be repeated for exposure of the next panel.

We will now discuss several different strategies for illumination of the flexible mask. All of the embodiments described above used three rollers to rotate the mask through the object plane of the projection lens. The mask is illuminated from below between two rollers whose separation is chosen to provide the necessary clearance for the hexagonal illumination beam. Another possibility for illuminating the mask is to wrap the mask around a drum which is optically transparent to the illumination beam. The relay optics that deliver the hexagonal illumination pattern to the mask could be placed in the hollow core of the mask drum. The hexagonal illumination beam would then be projected through the transparent wall of the drum to illuminate the mask.

Figure 8:
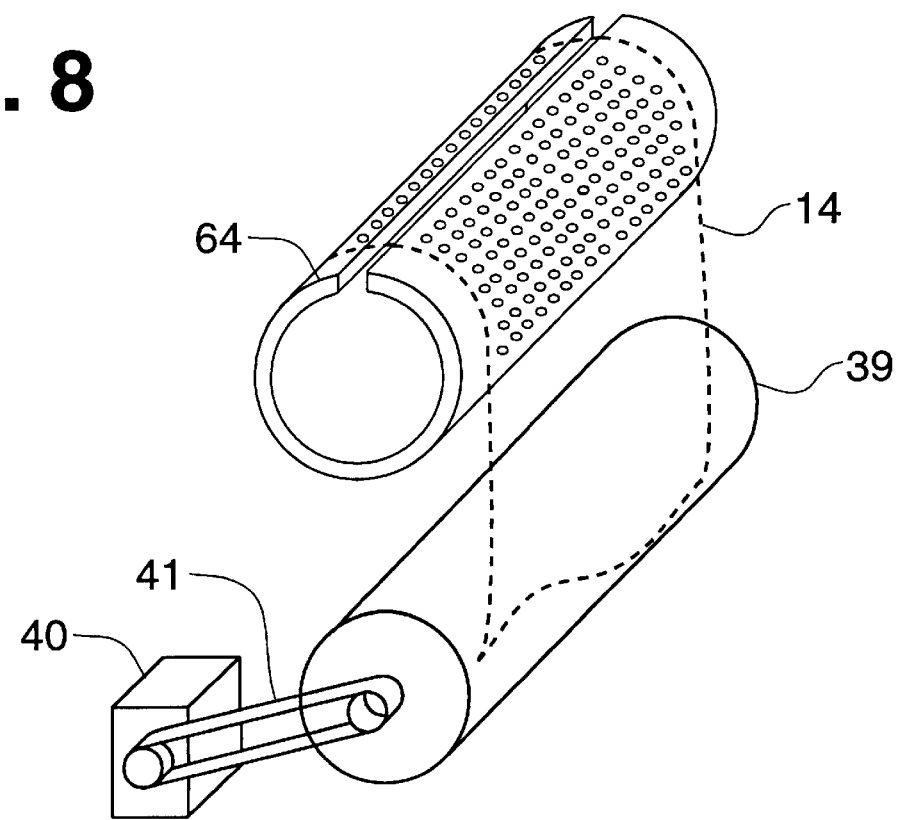
FIG. 8 shows how a stationary air-bearing roller can be used to allow both frictionless movement of the flexible mask and to allow illumination of the mask from below.

Another technique that can be used to illuminate the mask is shown in FIG. 8. The mask is circulated through the object field of the projection lens by two rollers: one of the rollers 64 is stationary; and the other roller 39 is free to rotate. The rotating roller 39 is connected to the drive system linked to the motor. This drive system is identical to the one which drives the substrate. The stationary roller is perforated with a large number of holes which are pressurized by a compressed gas source to produce a frictionless air-bearing. The mask rides across the surface of the stationary roller without any friction or restriction of movement. The stationary roller has a large slit across the top whose width is chosen to provide the necessary clearance for the hexagonal illumination beam.

The use of rollers to process the flexible substrate material is so versatile that it can be applied to lithography technologies other than scanning projection. It can be used, for example, in a direct-write application where the flexible substrate is helically scanned in the image field of a focusing system through which a laser beam is amplitude modulated. The use of rollers offers many advantages over current technologies based on direct-write tools.

System Design Example

In this section, we present an example of a system design based on this invention. We describe the design parameters, both optical and mechanical, for the system, and also discuss the hardware subsystems suitable for incorporation into the tool. The projection assembly is a refractive lens with a magnification of 1:1. It has a numerical aperture (NA) of 0.020 (f/25) which provides a resolution of 15 $\mu$m, more than adequate to meet the linewidth requirement of 25 $\mu$m for the next several years for electronic modules made on flexible substrates. In fact, it is always desirable to have an optical design resolution better than the minimum feature size to be patterned; this gives both a comfortable manufacturing process window and good line-edge definition. The imaging system has a depth of focus of 850 $\mu$m. This will comfortably accommodate the flatness tolerance of 125 $\mu$m typical of most flexible substrates. The projection lens has an image field of 60 mm diameter and is made of all fused silica elements. The light source is a xenon fluoride excimer laser operating at a wavelength of 351 nm with an average power output of $\geq$75 W. The choice of an excimer laser as the light source as contrasted with a mercury arc lamp is based on the fact that the optical efficiency for the useful UV power delivered to substrate is significantly greater for the laser (50–60%) than for the lamp (<2%).

The substrate handling module is designed to handle substrate diagonals of up to 120 inches. The mask and substrate are scanned by rotating drums through the object and image fields, respectively, of the projection lens. A linear translation stage carries both the mask and substrate rollers to scan in the orthogonal direction. Other optical modules in the exposure tool include a condenser subsystem, which comprises an input lens assembly for beam shaping and focusing, an intensity homogenizer, a relay lens assembly, and some steering mirrors. Additional components in the imaging optical train include a reversing unit and a folding mirror. The homogenizer employs a multiple-reflection light tunnel configuration. The reversing unit is be a split-roof mirror system. All mirrors in the system are high-reflectivity, multilayer dielectric-coated mirrors. All lens-element surfaces have anti-reflection dielectric coatings. The exposure tool also incorporates a view and focus system and an automatic alignment system based on capturing mask and substrate targets in a vision system. The overall specifications of the system example are summarized in Table 1, shown as FIG. 9.

Throughput Estimate

To demonstrate the attractive throughput of the patterning system of this invention, we present the following analysis based on realistic parameters. We use the projection lens assembly described above, with its design resolution of 15 $\mu$m and an image field diameter of 60 mm. Referring to FIG. 2, the length of a side of the hexagonal exposure field, $l_h$, is half of the image field diameter. Thus, $l_h$ =30 mm. The effective scan width w, as defined previously, is then w=1.5 $l_h$=45 mm. If the scan speed is $v_s$, then the raw exposure throughput (i.e., without taking into account any non-exposure overhead time), defined as the area A exposed per unit time, is given by A=w $v_s$. The appropriate scan speed is determined by the resist sensitivity and the available exposure intensity on the substrate. We use a resist sensitivity of $D_s$=160 mJ/cm$^2$, with the remark that many commonly used resists in representative thicknesses are often exposed with lower doses. To estimate the UV power incident on the panel, we use a conservative value of $\eta$=50% for the net optical efficiency of the optical train. This gives a value of 37.5 W for the power incident on the panel. For the above combination of hexagonal image field size, resist sensitivity and incident power, the stage can be used at speeds up to 52 cm/sec. The raw exposure throughput then can be estimated to be A=234 cm$^2$/sec=15.1 sq. ft/min.

The final important parameter that enters the throughput calculation is $t_{oh}$, the total overhead time per panel, which includes the load, unload and alignment times. Using $t_{oh}$ =30 sec and a scanned exposure area of 36×48 inches per panel, the net throughput can be estimated to be W=46 panels/hr, or 9.2 sq ft./min.

We remark that these throughput figures are several times greater than those possible with currently available tools. In addition, note that the system of this invention is also capable of high-throughput via generation, both in photosensitive and photo-ablative dielectric materials.

We claim:

1. A large-area, high-throughput, high-resolution, projection system for imaging a pattern from a mask (14) to a substrate (10), so that said mask and said substrate are scanned through the object field and image field, respectively, of a projection lens (26) having a characteristic object field and a characteristic image field, where the object field is illuminated by an illumination system (18), characterized in that:

the mask and substrate are flexible, and characterized by:

(a) a translation stage subsystem (12) to provide linear motion in a first dimension;

(b) flexible mask carrying means, carrying the flexible mask (14), to provide rotational motion to the flexible mask in a second dimension, such flexible mask carrying means being mounted on said stage subsystem (12), to present said flexible mask to the object field of the projection lens (26) and to the illumination system (18);

(c) flexible substrate carrying means, distinct from said flexible mask carrying means, to provide rotational motion to the substrate in said second dimension, such flexible substrate carrying means being mounted on said stage subsystem (12), to move the substrate through the, image field of projection lens (26); and (d) control means for providing and controlling rotational motion to said flexible mask carrying means and synchronized, equivalent motion to said flexible substrate carrying means in the second dimension, while providing motion in the first dimension to said flexible mask carrying means and simultaneously to said flexible substrate carrying means, for a complete area scan of a panel.

2. A large-area, high-throughput, high-resolution, projection system according to claim 1, further characterized in that:

said mask carrying means rotates said mask (14) in a continuous motion providing rotational scanning to said mask (14) along said second dimension; said substrate carrying means rotates said substrate (10) in a continuous motion providing rotational scanning to said substrate along said second dimension; and said translation stage (12) provides continuous motion to said mask carrying means and to said substrate carrying means along said first dimension with a velocity chosen so that for each rotation of the mask and substrate along said second dimension, said stage 12 advances said mask and said substrate by the effective scan width so that the combination of continuous linear motion along first said dimension and the continuous rotational motion along said second dimension results in a continuous helical scan which covers the entire panel.

3. A large-area, high-throughput, high-resolution, projection system according to claim 1, further characterized in that:

said mask carrying means rotates said mask (14) in an increment equal to the effective scan width along said second dimension; said substrate carrying means rotates said substrate (10) in an increment equal to the effective scan width along said second dimension; and said translation stage (12) provides continuous motion to said mask carrying means and to said substrate carrying means to scan the mask and substrate along said first dimension so that the combination of continuous linear motion along first said dimension and the intermittent rotational motion along said second dimension results in a serpentine scan which covers the entire panel.

4. A large-area, high-throughput, high-resolution, projection system according to claim 1, further characterized in that:

the flexible mask (14) is mounted to said flexible mask carrying means, and the flexible substrate (10) is mounted to said flexible substrate carrying means, so that there is a gap between substrate trailing edge (8) and substrate leading edge (9) on the next rotation, and there is a gap between mask trailing edge and mask leading edge, said control means advancing said translation stage (12) by the effective scan width when the object and image field of the projection lens falls on the gap between the mask and substrate edges, respectively, such that the combination of stepping along the first dimension and rotational scanning along the second dimension results in a scan which completely exposes the entire panel without any change in the direction of rotation.

5. A large-area, high-throughput, high-resolution, projection system according to claim 1, further characterized in that:

the mask (14) is mounted to said mask carrying means and the substrate (10) is mounted to said substrate carrying means so that there is a gap between substrate trailing edge (8) and leading edge (9), and there is a gap between mask trailing edge and leading edge, said control means advancing said translation stage (12) by the effective scan width when the object and image field of the projection lens falls on the gap between the mask and substrate edges, respectively, such that the combination of stepping along the first said dimension and rotational scanning along second said dimension results in a scan which completely and seamlessly exposes the entire substrate in a serpentine fashion by changing the direction of rotation between scans.

6. A large-area, high-throughput, high-resolution, projection system according to claim 1, further characterized in that said substrate carrying means is a single, cylindrical, rotating drum (34) around which said substrate is mounted.

7. A large-area, high-throughput, high-resolution, projection system according to claim 1, further characterized in that said substrate carrying means consists of at least two rotating rollers around which said substrate is mounted.

8. A large-area, high-throughput, high-resolution, projection system according to claim 1, further characterized in that the flexible mask (14) and the flexible substrate (10) are mounted side-by-side to the same carrying means which rotates both the flexible mask and flexible substrate along the second dimension.

9. A large-area, high-throughput, high-resolution, projection system according to claim 1, further characterized in that said mask carrying means comprises a plurality of rollers, around which the mask is wrapped, to provide a gap between two said rollers so that any portion of said mask which may fall in the object field of said projection lens can be illuminated from below.

10. A large-area, high-throughput, high-resolution, projection system according to claim 9, further characterized in that said substrate carrying means consists of a plurality of rollers, one of which supports the substrate directly under the image field of said projection lens and the others being positioned to minimize the lens track length and thereby minimize the footprint and payload of the translation stage (12).

11. A large-area, high-throughput, high-resolution, projection system according to claim 1, further characterized in that:

said mask carrying means comprises a plurality of rollers, around which the mask is wrapped, such that one of the rollers supports the mask directly under the object field of said projection lens and has the following characteristics: said roller is non-rotating; said roller has many orifices on its outside surface which are connected to a pressurized supply of compressed air or other gas which provides a frictionless surface over which the flexible mask may move; said roller has a gap so that any portion of said mask which may fall in the object field of said projection lens can be illuminated from below through same gap.

12. A large-area, high-throughput, high-resolution, projection system according to claim 1, further characterized in that:

said substrate carrying means comprises a plurality of rollers, comprising supply roller (36) and take-up roller (37), located inside a larger substrate drum (28), arranged to feed a continuous roll of substrate material (10) from said supply roller, around the periphery of said substrate presentation drum, and collected on said take-up roller, the substrate carrying means capable of rotating to scan said substrate on the periphery of said substrate drum through the image field of said projection lens for imaging.

13. A large-area, high-throughput, high-resolution, projection system according to claim 1, further characterized in that:

said substrate carrying means comprises a plurality of rollers to expose one panel from a continuous roll of substrate material (10), where said material is fed from the supply roller (36) around the substrate roller (38) and collected on the take-up roller (37), said substrate roller (38) supporting the substrate material directly under the image field of said projection lens (26) and all said rollers (36–38) have their axes parallel to one another.

14. A method for imaging a pattern from a flexible mask (14) to a flexible substrate (10), so that the mask and the substrate are scanned through the object and image field, respectively, of a projection lens (26) having a characteristic object field and a characteristic image field, where the object field is illuminated by an illumination system (18):

characterized by (a) providing linear motion in a first dimension to flexible mask carrying means and flexible substrate carrying means by a translation stage subsystem (12);

(b) providing rotational motion by the flexible mask carrying means to the flexible mask in a second dimension, orthogonal to the first dimension, such mask carrying means being mounted on said stage subsystem (12), to present the mask to the object field of the projection lens (26) and to the illumination means;

(c) providing rotational motion by the substrate carrying means to the flexible substrate in the second dimension, such substrate carrying means being mounted on said stage subsystem (12), to present the substrate to the image field of the projection lens (26); and (d) providing synchronization by control means for rotational motion to said mask carrying means and equivalent motion to said substrate carrying means in the second dimension while providing synchronized motion in the first dimension to said mask carrying means and simultaneously to said substrate carrying means, for a complete area scan of a panel.

15. A method for imaging a mask pattern onto a substrate according to claim 14 by helical scanning accomplished by performing the following steps:

(a) said mask (14) is carried by mask carrying means and said substrate (10) is carried by substrate carrying means so that both are continuously rotating along said second dimension;

(b) said mask carrying means and said substrate carrying means are positioned by the linear translation stage (12) near the end of its range of travel so that the said object and image field of said projection lens (26) falls outside of the mask and substrate area;

(c) said translation stage scans said mask and substrate carrying means at a constant velocity from one end of its range of travel to the other where said range of travel is sufficient to cover the dimension of the substrate parallel to substrate roller axis where the velocity is chosen so that for each rotati6n of the mask and substrate along said second dimension, said stage (12) advances said mask and said substrate by the effective scan width so that the combination of continuous linear motion along first said dimension and the continuous rotational motion along second said dimension results in a continuous helical scan which covers the entire panel, this motion simultaneously scans said mask and said substrate through the object and image field, respectively, of the projection lens (26) effectively transferring the pattern on the mask illuminated by the illumination system (18) to the substrate.

16. A method for imaging a mask pattern onto a substrate according to claim 14 by a serpentine scan accomplished by performing the following steps:

(a) said mask carrying means and said substrate carrying means are positioned by the linear translation stage (12) near the end of its range of travel so that the said object and image fields of said projection lens (26) fall outside of the mask and substrate area;

(b) said linear stage performs a fast linear scan at a positive constant velocity from one end of its range of travel to the other where said range of travel is sufficient to cover the dimension of the substrate parallel to substrate roller axis, this motion simultaneously scans said mask and said substrate through the object and image field, respectively, of the projection lens (26) effectively transferring the pattern on the mask illuminated by the illumination system (18) to the substrate;

(c) after the linear scan has traversed the substrate, said mask carrying means and said substrate carrying means rotate said mask and said substrate by an amount equal to the effective scan width;

(d) said linear stage performs a fast linear scan at a negative constant velocity back to its original starting point to cover the dimension of the substrate parallel to said substrate roller axis, after which said mask carrying means and said substrate carrying means again rotate said mask and said substrate by an amount equal to the effective scan width;

(e) steps (a) through (d) are repeated until the entire pattern on the mask has been transferred to the substrate.

17. A method for imaging a mask pattern onto a substrate according to claim 14 by a series of rotational scans accomplished by performing the following steps:

(a) said mask (14) is carried by mask carrying means and said substrate (10) is carried by substrate carrying means so that both are continuously rotating along said second dimension;

(b) said mask carrying means and said substrate carrying means are positioned by the linear translation stage (12) near the end of its range of travel so that the said object and image fields of said projection lens (26) fall outside of the mask and substrate area;

(c) said linear stage advances said mask and substrate by the effective scan width along said first dimension after the trailing edges of the mask and substrate are beyond the object and image fields, respectively, of said projection lens (26) and before the leading edges of the mask and substrate enter the object and image fields, respectively, of same projection lens, the gap between the trailing and leading edges of the mask and substrate is large enough, and the speed of said translation stage is fast enough, so that the object and image fields of said lens are positioned in the gap during the motion implemented by said translation stage;

(d) said mask (14) is continuously rotated by mask carrying means and said substrate (10) is continuously rotated by substrate carrying means along the same direction of said second dimension so that both are advanced by one revolution thus completing one scan along the length of the mask and substrate;

(e) steps (c) through (d) are repeated until the entire substrate has been patterned by the mask.

18. A method for imaging a mask pattern onto a substrate according to claim 14 by a series of rotational scans accomplished by performing the following steps:

(a) said mask (14) is positioned by mask carrying means and said substrate (10) is positioned by substrate carrying means so that the object and image field of said projection lens (26) is positioned on the gap between the leading and trailing edges of the mask and substrate, respectively, and said mask and substrate carrying means is positioned by said translation stage so that said object and image field is aligned with one edge of the mask and substrate, respectively, along said first dimension;

(b) said mask (14) is rotated by mask carrying means and said substrate (10) is rotated by substrate carrying means so that both are advanced at a constant velocity by one revolution thus completing one scan along the length of the mask and substrate;

(c) once the rotational scan is complete, the mask and substrate carrying means stops rotating said mask and substrate so that the object and image field is again positioned on the gap between the leading and trailing edges of the mask and substrate, respectively;

(d) said linear translation stage advances the mask carrying means and substrate carrying means so that said mask and said substrate are moved by an amount equal to the effective scan width along said first dimension;

(e) said mask (14) is rotated by mask carrying means and said substrate (10) is rotated by substrate carrying means so that both are advanced at a constant velocity in the reverse direction by one revolution thus completing an additional scan along the length of the mask and substrate;

(f) once the rotational scan is complete, the mask and substrate carrying means stops rotating said mask and substrate so that the object and image field is again positioned on the gap between the leading and trailing edges of the mask and substrate, respectively, and said linear translation stage advances the mask carrying means and substrate carrying means so that said mask and said substrate are moved by an amount equal to the effective scan width along said first dimension;

(g) steps (b) through (f) are repeated until the entire substrate has been exposed.

19. A method for imaging a pattern from a mask (14) to a substrate (10) by scanning the mask and the substrate through the object field and image field, respectively, of a projection lens (26) having a characteristic object field and a characteristic image field, where the object field is illuminated by an polygonal-shaped beam from an illumination system (18), to enable complementary overlapping scans, characterized by:

(a) providing a master pattern imprinted on a flexible mask presented by the mask carrying means to the object field of the projection lens (26) and to the illumination means;

(b) providing a flexible substrate presented by the substrate carrying means to the image field of the projection lens (26);

(c) providing linear motion in a first one of the two dimensions to mask and substrate carrying means by a translation stage subsystem (12); and (d) providing synchronized rotational motion by the mask carrying means to the flexible mask and providing synchronized rotational motion by the substrate carrying means to the flexible substrate.

20. Apparatus for imaging a pattern from a flexible mask (14) to a flexible substrate (10), by scanning the flexible mask (14) and flexible substrate (10) so that the mask and the substrate are scanned through the object field and image field, respectively, of a projection lens (26) having a characteristic object field and a characteristic image field, where the object field is illuminated by a polygonal-shaped beam from an illumination system (18), to enable complementary overlapping scans, characterized by:

(a) a translation stage subsystem (12) to provide linear motion in a first dimensions;

(b) mask carrying means, carrying the flexible mask (14), and substrate carrying means, carrying the flexible substrate (10), to provide synchronized rotational motion to the mask and to the substrate in a second dimension, orthogonal to the first dimension, such mask carrying means and substrate carrying means being mounted on said stage subsystem (12), and to present the mask and the substrate to the object field and the image field, respectively, of the projection lens (26) and to the illumination means;

(c) control means for controlling rotational and linear motion to said mask carrying means and to said substrate carrying means for a complete area scan of a panel.

21. Apparatus, according to claim 20, further characterized in that the area scan of a panel is continuous and helical.

22. Apparatus, according to claim 20, further characterized in that the area scan of a panel is serpentine.

23. Apparatus, according to claim 20, further characterized in that said substrate carrying means and said mask-carrying means are driven by a common motor.

24. Apparatus for patterning a flexible substrate (10), so that the substrate is scanned through the image field of an illumination system having a characteristic object field and a characteristic image field, characterized by:

(a) a translation stage subsystem (12) to provide linear motion in a first dimension;

(b) means to provide rotational motion to the substrate in a second dimension, orthogonal to the first dimension, carrying the flexible substrate (10), such substrate carrying means being mounted on said stage subsystem (12), to move the substrate through the image field of the illumination system; and (c) control means for controlling rotational motion to said substrate carrying means in the second dimension, while providing motion in the first dimension to said substrate carrying means, for a complete area scan of a panel.

25. Apparatus for patterning a substrate (10), so that the substrate is scanned through a processing device, characterized by:

(a) a translation stage subsystem (12) to provide linear motion to the substrate (10) in a first dimensions;

(b) substrate carrying means, to provide rotational motion to the substrate (10) in a second dimension, orthogonal to the first dimension, carrying the substrate (10), such substrate carrying means being mounted on said stage subsystem (12);

(c) the substrate being flexible to bend over rotational support means in the substrate carrying means which rotates same substrate in the second dimension; and (d) control means for controlling rotational motion to said substrate carrying means in the second dimension, while providing motion in the first dimension to said substrate carrying means, for a complete area scan of a panel.

26. Apparatus for scanning a substrate, with respect to a processing device, for a composite scanning motion characterized by:

(a) the substrate being sufficiently flexible to bend in at least a partial loop, for rotational travel in a first dimension;

b) a translation stage including a moving stage platform with a footprint of a certain size, serving to provide lateral motion in a second dimension, orthogonal to the first dimension, within that footprint;

(c) said substrate holder comprising loop support means, mounted on said stage platform, with its axis parallel to the travel of said stage platform; and (d) control means to provide a complete area scan by a composite linear motion and rotational motion;

whereby the flexible substrate is supported, compressed by bending, for rotational motion in the primary dimension for presentation to the processing device, while contemporaneous lateral motion in the secondary dimension is provided by said stage, enabling processing of a substrate panel significantly larger than the footprint of said platform in at least the primary dimension.

27. A large-area, high-throughput, high-resolution, projection system for imaging a pattern from a flexible mask (14) to a flexible substrate (10), by rotating the flexible mask (14) and flexible substrate (10) in one dimension and linearly moving the mask and the substrate in an orthogonal dimension so that the mask and the substrate are scanned through the object field and image field, respectively, of a projection lens (26), where the object field is illuminated by an illumination system (18), characterized by:

(a) a translation stage subsystem (12) to provide linear motion in a first one of the two dimensions;

(b) mask carrying means, carrying the flexible mask (14), to provide rotational motion to the mask in a second one of the two dimensions, such mask carrying means being mounted on said translation stage subsystem (12), to present the mask to the object field of the projection lens (26) and to the illumination system (18), said mask carrying means being a drum which is optically transparent so that any portion of the mask which may fall in the object field of the projection lens can be illuminated from below;

(c) substrate carrying means, to provide rotational motion to the substrate in a second one of the two dimensions, carrying the flexible substrate (10), such substrate carrying means being mounted on said translation stage subsystem (12), to move the substrate through the image field of projection lens (26); and (d) control means for providing and controlling rotational motion to said mask carrying means and for providing synchronized, equivalent motion to said substrate carrying means in the second dimension, while providing motion in the first dimension to said mask carrying means and simultaneously to said substrate carrying means, for a complete area scan of a panel.

* * * * *